(12) United States Patent
Matsusue

(10) Patent No.: US 7,554,259 B2
(45) Date of Patent: Jun. 30, 2009

(54) LIGHT EMITTING DISPLAY APPARATUS HAVING EXCELLENT COLOR REPRODUCIBILITY

(75) Inventor: Noriyuki Matsusue, Hirakata (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/078,714

(22) Filed: Mar. 14, 2005

(65) Prior Publication Data

US 2005/0212407 A1   Sep. 29, 2005

(30) Foreign Application Priority Data

Mar. 24, 2004  (JP)  .............................. 2004-087120
Dec. 27, 2004  (JP)  .............................. 2004-378214

(51) Int. Cl.
*H01J 63/04*   (2006.01)
*H01J 1/62*   (2006.01)

(52) U.S. Cl. ....................... 313/503; 313/498; 313/504; 313/505; 313/506; 428/690; 428/917

(58) Field of Classification Search .................. 313/504
See application file for complete search history.

(56) References Cited

U.S. PATENT DOCUMENTS

| | | | | |
|---|---|---|---|---|
| 6,133,692 | A * | 10/2000 | Xu et al. ...................... | 313/506 |
| 2002/0190257 | A1* | 12/2002 | Yamazaki et al. ............. | 257/72 |
| 2003/0109839 | A1* | 6/2003 | Costea et al. ................ | 604/358 |
| 2003/0222577 | A1* | 12/2003 | Lu ............................... | 313/504 |
| 2005/0067954 | A1* | 3/2005 | Nishikawa et al. ........... | 313/506 |
| 2005/0073230 | A1* | 4/2005 | Nishikawa et al. ........... | 313/111 |
| 2005/0212414 | A1* | 9/2005 | Matsusue et al. ............. | 313/504 |

FOREIGN PATENT DOCUMENTS

JP   2003257622 A  *  9/2003
JP   2005-149800   6/2005

OTHER PUBLICATIONS

Japanese Office Action issued in Japanese Patent Application No. JP 2004-378214, dated on Apr. 15, 2008.

* cited by examiner

*Primary Examiner*—Nimeshkumar D. Patel
*Assistant Examiner*—Natalie K Walford
(74) *Attorney, Agent, or Firm*—McDermott Will & Emery LLP

(57) ABSTRACT

An apparatus is provided with a plurality of organic light emitting devices, each having an organic light emitting layer that synthesizes two or more colors of light that are complementary to each other thereby producing white light, and a resonant structure by which a resonant wavelength is set to a predetermined wavelength, and outputs the white light via the resonant structure. The apparatus further comprises a plurality of wavelength selection units on a path through which the white light is outputted, each wavelength selection unit transmitting only light of a particular wavelength included in the outputted white light, the predetermined wavelength substantially coinciding with a wavelength corresponding to a primary color whose luminous intensity is, if without the resonant structure, the lowest of three primary colors included in the produced white light to bring it close to white light ideal for an image display light source.

2 Claims, 6 Drawing Sheets

LIGHT EMITTING DISPLAY APPARATUS HAVING EXCELLENT COLOR REPRODUCIBILITY

BACKGROUND OF THE INVENTION (1) Field of the Invention

The present invention relates to a light emitting display apparatus, and particularly relates to a technology for improving color reproducibility.

(2) Related Art

Recently, light emitting display apparatuses that drive self luminous devices by means of thin film transistors (hereinafter also called "TFT") are receiving attention as display devices having high efficiency, high definition, low power consumption, and high-speed response.

Among such light emitting display apparatuses, those having a structure of causing organic light emitting devices stacked on a TFT substrate to emit light, and extracting the light highly efficiently in a direction of a so-called top side (i.e. opposite direction to a side of the TFT substrate on which TFTs, wiring, and so on, are provided) are under development. This type of light emitting display apparatus is called a top-emission organic electroluminescence panel. Hereinafter, an organic electroluminescence panel is simply referred to as "organic EL panel".

Organic EL panels obtain white light by synthesizing two lights each having complementary color to the other. Particularly in a top-emission organic EL panel, white light obtained from organic light emitting devices is outputted towards the aforementioned top side direction. Then color filters provided ahead in the direction are used to selectively separate the three primary colors of the white light by transmission, thereby realizing color display. Such a top-emission organic EL panel yields characteristics such as high light emitting efficiency and brightness in resulting pictures, in addition to general characteristics of the organic EL panels such as realization of a thin body and a wide viewing angle.

One type of top-emission EL panels has a resonant structure that strengthens light of a particular wavelength by making a position of a resonance frequency coincide with a wavelength peak position of light, as disclosed by Japanese Laid-open Patent Application No. H07-78689 for example.

However, as mentioned above, an organic EL panel obtains white light by synthesizing two lights each having complementary color to the other, and the three primary colors differ in luminous intensity. Therefore it is difficult to set chromaticity of white light to desired level.

For example, suppose a case where blue light and orange light, each having a complementary color to the other, are emitted and synthesized, and the luminous intensity of each primary color component included in the two lights is measured. Some results show (as in FIG. 4) that before transmission through a color filter, the blue region and the red region of the spectrum show large luminous intensity in emitted color, but the green region situated therebetween shows weak luminous intensity.

In such a case, even after color-filter transmission, red light and blue light will have stronger luminous intensity than green light.

Accordingly, after synthesizing the three primary colors in such a state, resulting white will be a little purplish, for example. This means that white having desirable chromaticity (i.e. pure white) cannot be obtained, impairing color reproducibility in color display based thereupon.

For example, a red light obtained after transmission of a red color filter will have undesirable reproducibility because its source light included in the white is a result from the synthesized lights, and not a single wavelength light.

SUMMARY OF THE INVENTION

The present invention has been conceived in view of the above problems, and has an objective of providing a light emitting display apparatus having excellent color reproducibility.

So as to achieve this objective, the light emitting display apparatus according to the present invention is a light emitting display apparatus that realizes color display, having: a plurality of organic light emitting devices, each of which includes an organic light emitting layer that synthesizes two or more complementary colors of light that are complementary to each other thereby producing white light, has a resonant structure by which a resonant wavelength is set to a predetermined wavelength, and outputs the white light via the resonant structure; and a plurality of wavelength selection units provided on a path through which the white light is outputted, each wavelength selection unit transmitting only light of a particular wavelength included in the outputted white light, where the predetermined wavelength substantially coincides with a wavelength corresponding to a primary color whose luminous intensity is, if without the resonant structure, the lowest of three primary colors included in the produced white light for the purpose of bringing the produced white light close to white light ideal for an image display light source.

With the stated construction, non-uniformity in luminous intensity among three primary colors is alleviated by means of amplified luminous intensity due to resonance. This will help obtain white light in which the primary colors are balanced well.

As a result, excellent color reproducibility is rendered by color display realized based on this white light and using the wavelength selection units.

The present invention may have a structure in which the complementary colors of light are blue and orange, the primary color whose luminous intensity is the lowest is green, and the resonant wavelength is set within the green region of the spectrum.

With the stated construction, when the luminous intensity of green light is the lowest in a case where blue and orange constitute the complementary colors of light, the green light luminous intensity is increased by the resonance to be comparable to those of the other primary color lights, thereby alleviating the non-uniformity in luminous intensity among three primary colors. As a result, white light in which the three primary colors are balanced well is obtained, and green-color reproducibility is enhanced as well.

The green region of the spectrum may be a wavelength band in a range of 520 nm to 560 nm, inclusive.

With the stated construction, the resonant wavelength is set to a wavelength band that has a certain width, so as to increase luminous intensity within the green region.

The present invention may have a structure in which the complementary colors of light are blue and orange, the primary color whose luminous intensity is the lowest is red, and the resonant wavelength is set within the red region of the spectrum.

With the stated construction, when the luminous intensity of red light is the lowest in a case where blue and orange constitute the complementary colors of light, the red light's luminous intensity is increased by the resonance to be comparable to those of the other primary color lights, thereby alleviating the non-uniformity in luminous intensity among three primary colors. As a result, white light in which the three primary colors are balanced well is obtained, and red-color reproducibility is enhanced as well.

The red region of the spectrum may be a wavelength band in a range greater than 560 nm but no greater than 650 nm.

With the stated construction, the resonant wavelength is set to a wavelength band that has a certain width, so as to increase luminous intensity within the red region.

Each of the wavelength selection units may be a color filter that transmits light having a corresponding one of the three primary colors.

With the stated construction, color display is realized based on white light using the color filters. As a result, excellent color reproducibility is rendered with a simple structure.

BRIEF DESCRIPTION OF THE DRAWINGS

These and other objects, advantages and features of the invention will become apparent from the following description thereof taken in conjunction with the accompanying drawings that illustrate a specific embodiment of the invention. In the drawings.

DESCRIPTION OF THE PREFERRED EMBODIMENTS

<Construction>

Figure 1:
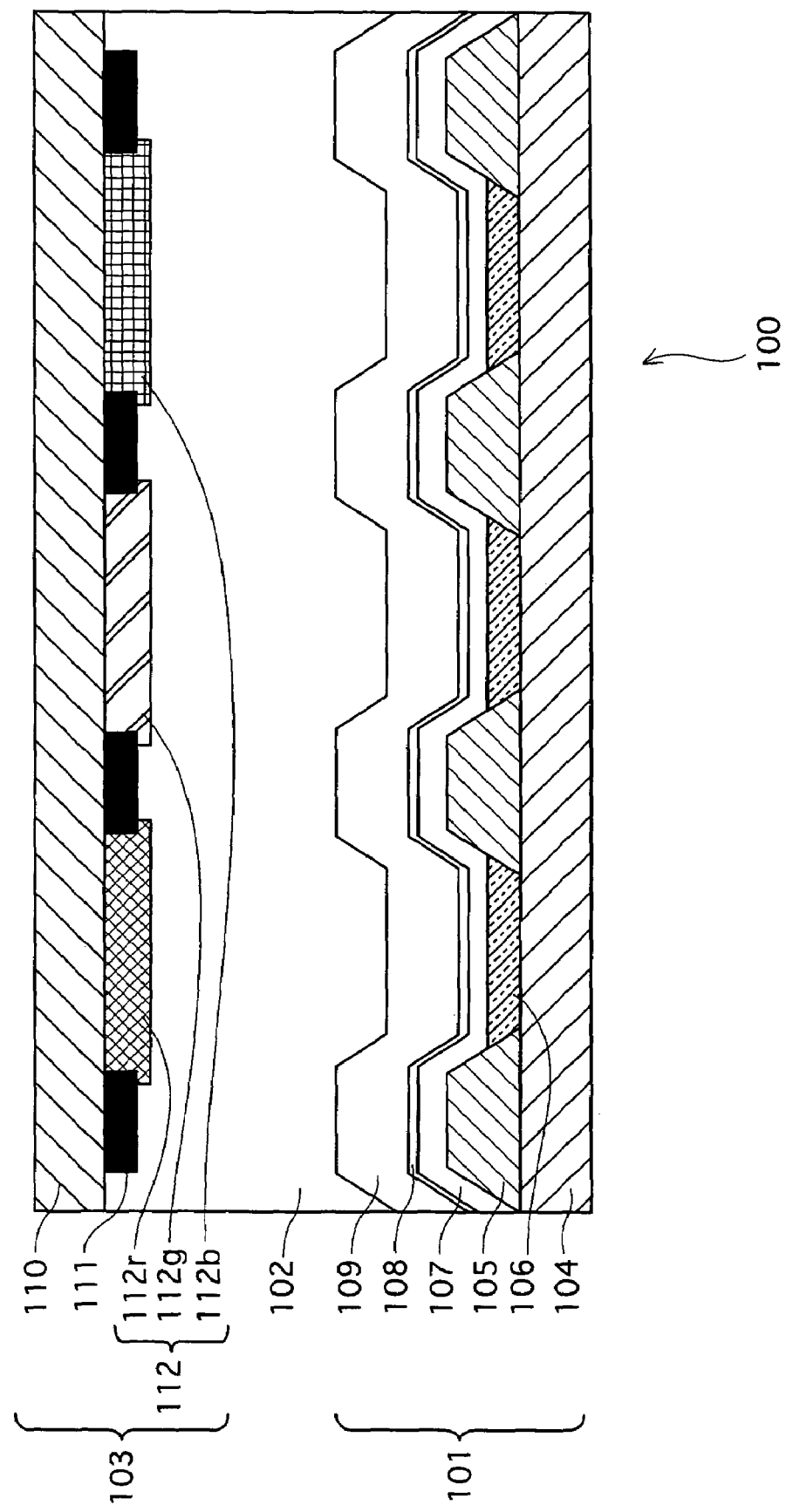
FIG. 1 is a schematic sectional diagram of an organic EL panel according to an embodiment of the present invention.

FIG. 1 is a schematic sectional diagram of an organic EL panel, which is one example of a light emitting display apparatus according to an embodiment of the present invention.

As FIG. 1 shows, an organic EL panel 100 of the present embodiment has a construction in which organic EL devices 101 that emit light themselves face a color filter substrate 103, with a sealing layer 102 therebetween.

In the color filter substrate 103, the color filter groups 112 are arranged on a main surface of a transparent substrate 110.

The transparent substrate 110 is made of glass having a thickness of about 0.5 mm-1.0 mm, but may alternatively be made of a plastic film.

The color filter groups 112 each include color filters 112r, 112g, and 112b, each of which transmits light of a corresponding one of three primary colors. The color filters 112r, 112g and 112b have a thickness of approximately no less than 1 μm but no more than 10 μm. In addition, black matrices 111 are provided between adjacent color filters. The color filters 112r, 112g, and 112b may be formed in stripes, or in matrix so that each color filter corresponds to a sub-pixel of a pixel.

The black matrices 111 are each a black film having a thickness of about 1 μm to 6 μm, and prevents light from leaking into adjacent sub-pixels, so that intended colors are precisely expressed.

The sealing layer 102 fills an internal space between the color filter substrate 103 and the organic light emitting device 101. As a result, the sealing layer 102 restrains entry of oxygen or water from outside, and restrains reflection on an interface of the organic light emitting device 101, thereby efficiently transmitting light outputted from the organic light emitting device 101 towards the color filter groups 112.

The sealing layer 102 is made of a material that transmits visible light and has a refractive index of 1.3-2.5. For example, an organic material such as transparent silicone rubber, transparent silicone gel, an epoxy resin, and an acryl resin may be used.

The organic light emitting device 101 is structured as follows. A plurality of TFTs (not shown in the drawing), which are covered with a planarized insulating film (not shown in the drawing), are provided on one of the main surfaces of a TFT substrate 104. An insulation layer 105 is formed like a lattice, so as to surround each of the TFTs. Film-like anodes 106 are formed in areas surrounded by the insulation layer 105. An organic layer 107 including a light emitting layer, a cathode 108, and a protection layer 109 are formed in this order so as to cover the TFT substrate 104, the insulation layer 105, and the anodes 106.

The anodes 106 are made of a material having a high work function for facilitating efficient hole injection. Specifically in this example, the anodes 106 are made of a transparent conductive metal oxide layer made of ITO (indium tin oxide). Under the anodes 106, it is preferable to form metal layers having a high reflectivity, such as chrome, silver, platinum, or an alloy containing them.

It is possible to make the conductive metal oxide layer using IZO (indium zinc oxide), instead of ITO.

In a case where the aforementioned metal layers are provided, boundary surfaces between the metal layers and the conductive metal oxide layers will function as first reflective surfaces for a resonant structure.

If without the metal layers, on the contrary, parts of the TFT substrate 104 that contact the anodes 106 reflect light in a certain ratio. Therefore the boundary surfaces between the anodes 106 and the TFT substrate 104 will function as the aforementioned first reflective surface.

The following explanation assumes the structure without the metal layers.

Figure 2:
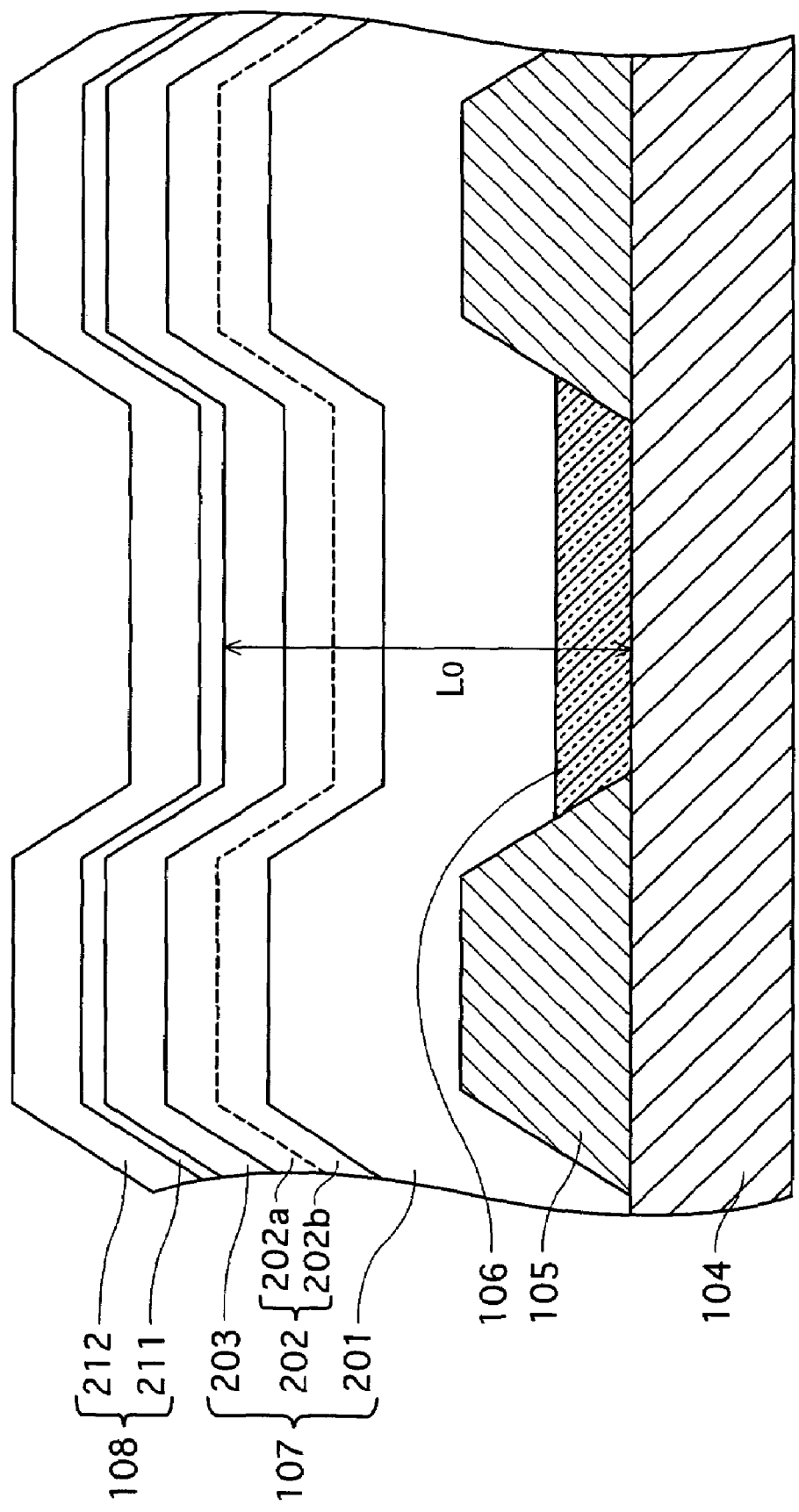
FIG. 2 is a detailed sectional diagram of an organic layer and a cathode, according to the embodiment of the present invention.

As FIG. 2 shows, the cathode 108 has a double-layer structure made of a semi-transparent electrode 211 and a transparent electrode 212.

The transparent electrode 212 is formed on the semi-transparent electrode 211, and is made of a translucent metal oxide such as ITO and IZO.

The semi-transparent electrode 211 is formed on the organic layer 107, and by nature transmits part of the light arrived from the organic layer 107 and reflects the other part.

The semi-transparent electrode 211 is a metal thin film having a low work function and a thickness of 200 angstrom or below. Concrete examples of the material therefor include: a metal such as aluminum, calcium, magnesium, silver, gold; an alloy of these metals and lithium and the like; and an alloy of magnesium and silver.

Note that a boundary surface between the semi-transparent electrode 211 and the organic layer 107 functions as a second reflective surface of the resonant structure.

The protection layer 109 is a thin-film layer that covers and protects a surface of the transparent electrode 212. The protection layer 109 is made of a material which is highly transparent for visible light, electrically insulative, and resistant against moisture, oxygen and the like. To be specific, the protection layer 109 can be made of, for example, SiOX, SiNX, AlOX and the like, and formed using sputtering, vapor deposition, a chemical vapor deposition (CVD) method or the like. The organic layer 107 is made by stacking a hole transport layer 201, an organic light emitting layer 202, and an electron transport layer 203, in the stated order.

The hole transport layer 201 is a path for holes that are injected from the anodes 106, and move to the organic light emitting layer 202 in accordance with application of a voltage between the anodes 106 and the cathode 108.

Examples for the material for the hole transport layer 201 include (N,N'-Di(naphthalene-1-yl)-N,N'-diphenyl-benzidine:NPB), (4,4',4''-tris(3-methylphenylphenylamino)triphenylamine:MT DATA), and (N,N'-diphenyl-N,N'-di(3-methylphenyl)-1,1'-biphenyl-4,4'-diamine:TPD).

The electron transport layer 203 is a path for electrons that are injected from the cathode 108, and move to the organic light emitting layer 202 in accordance with application of a voltage between the anodes 106 and the cathode 108.

The electron transport layer 203 is made of a material such as $(Alq_3)$, and (bis(10-hydroxybenzo[h]quinolinato)beryllium:$Bebq_2$).

The organic light emitting layer 202 emits white light in the following manner. Electrons and holes respectively move towards the organic light emitting layer 202, and are recombinated at an interface between the hole transport layer 201 and the organic light emitting layer 202, at an interface between the electron transport layer 203 and the organic light emitting layer 202, or within the organic light emitting layer 202. The recombination generates an energy, which excites electrons of organic molecules in the organic light emitting layer 202. When the excited electrons move to a relaxed state, white light is emitted.

The aforementioned white light is obtained by synthesizing the blue light and the orange light.

The organic light emitting layer 202 is made of a material such as $(Alq_3)$, or (bis(10-hydroxybenzo[h]quinolinato)beryllium:$Bebq_2$) that contains a quinacridone derivative.

<Design of the Organic EL Panel 100>

The organic EL panel 100 of the present embodiment is designed to set a resonant wavelength to fall within the green region, unlike conventional techniques that do not take a resonant wavelength into consideration.

Generally speaking, the relation in the following equation 1 holds true for a resonant wavelength $\lambda_0$, an optical distance $L_0$ of a resonance unit, and a phase shift $\phi$. In view of this, so as to set the resonant wavelength of the organic light emitting device 101 within the green region (i.e. 520 nm-560 nm), one way of designing is to first define a target value of the resonant wavelength $\lambda_0$, then to design the optical distance $L_0$ of the resonance unit and the phase shift $\phi$ to satisfy this equation 1.

$$2L_0/\lambda_0 + \phi/(2\pi) = m \quad \text{(Equation 1)}$$

$L_0$: optical distance of resonance unit
$\lambda_0$: resonant wavelength (nm)
$\phi$: phase shift (Rad)
m: integer As follows, further details of the organic EL panel 100 designing are described. The resonant wavelength $\lambda_0$ and the integer m are determined in the designing process. The resonant wavelength $\lambda_0$ is set in a range of 520 nm to 560 nm inclusive.

The integer m is usually set to be 0 or 1.

The phase shift $\phi$ indicates a phase shift that is generated when light produced by the organic layer 107 is reflected by the surfaces forming the resonant structure. The phase shift $\phi$ is determined by materials forming constituents composing the optical path and surface properties of interfaces.

The value of the phase shift $\phi$ can be obtained in the following manner.

First, a refractive index n1 and an absorption coefficient k of the anodes 106 on the TFT substrate 104 are obtained using spectroscopic ellipsometry measurement.

Subsequently, a refractive index n2 of the hole transport layer 201, which is in contact with the anodes 106, is also obtained using spectroscopic ellipsometry measurement.

Based on the refractive index n1, the absorption coefficient k, and the refractive index n2, the phase shift $\phi$ is obtained by means of a method disclosed in a known document (Journal of Applied Physics, Vol. 80 (1996) p 6954). In detail, respective phase shifts of the two interfaces forming the resonant structure are obtained and added together. The sum of the addition is the phase shift $\phi$.

The optical distance $L_0$ is an optical distance between the first reflective surface and the second reflective surface, mentioned above. That is, in the present embodiment, the optical distance $L_0$ is obtained based on a product of film thickness and refractive index respectively for 1) the anodes 106, 2) the hole transport layer 201, 3) the organic light emitting layer 202 (202a and 202b), and 4) the electron transport layer 203.

For example, the optical distance $L_0$ is obtained as follows, when the thickness for each of the layers 1)-4) is as follows: 1) 800 angstrom, 2) 750 angstrom, 3) 700 angstrom, and 4) 100 angstrom, and the refractive indices for the layers 1)-4) are as follows: 1) 2.2, 2) 1.8, 3) 1.8, and 4) 1.8.

$$L_0 = 800*2.2 + 750*1.8 + 300*1.8 + 400*1.8 + 100*1.8 \quad \text{(Equation 2)}$$

The value of $L_0$ calculated from this equation 2 is 455 nm, and the value of ($\phi/(2\pi)$) will be −0.7.

Therefore, the resonant wavelength $\lambda_0$ will be 535 nm, which is desirably within the green region.

Taking a production accuracy into consideration, the resonant wavelength will vary as the thickness of each layer of the aforementioned 1)-4) varies.

Realistically, if the resonant wavelength $\lambda_0$ is set in a range of 520 nm to 560 nm, the intensity balance is adequate for the three primary color lights. Accordingly, it is desirable to set the resonant wavelength $\lambda_0$ within this range.

Note that in this case the organic layer film thickness is 1450 nm-1700 nm, and the resonant wavelength $\lambda_0$ falls within the green region as intended. If not, modification is performed to the thickness or the refractive index of each layer, or the phase shift $\phi$, so as to bring the resonant wavelength close to the intended value.

As stated above, it is possible to first define a target value of the resonant wavelength $\lambda_0$, and to adjust other values such as the optical distance $L_0$ and the phase shift $\phi$ afterwards.

The values of the optical distance $L_0$ and the phase shift $\phi$ can be adjusted to take any values, as long as the resonant wavelength $\lambda_0$ takes a desired value as a result. However, it is more realistic to adjust the value of the optical distance $L_0$, as the value of the optical distance $L_0$ is in the same term as the value of the resonant wavelength $\lambda_0$ according to the equation 1.

<Effect of Resonance-wavelength Setting>

Blue light and orange light, each having a complementary color to the other, are emitted from the organic light emitting layer 202. A green light, whose wavelength band falls therebetween, tends to be smaller than a blue light and a red light.

However, the organic EL panel 100 in the present embodiment is designed to set a resonant wavelength to fall within the green region, unlike conventional techniques that do not take a resonant wavelength into consideration. As a result, a green light resonates between the first reflective surface and the second reflective surface stated above, thereby increasing the luminous intensity to be transmitted through the semitransparent electrode 211 to outside compared to the conventional green light.

<Verification of Effect>

Figure 3:
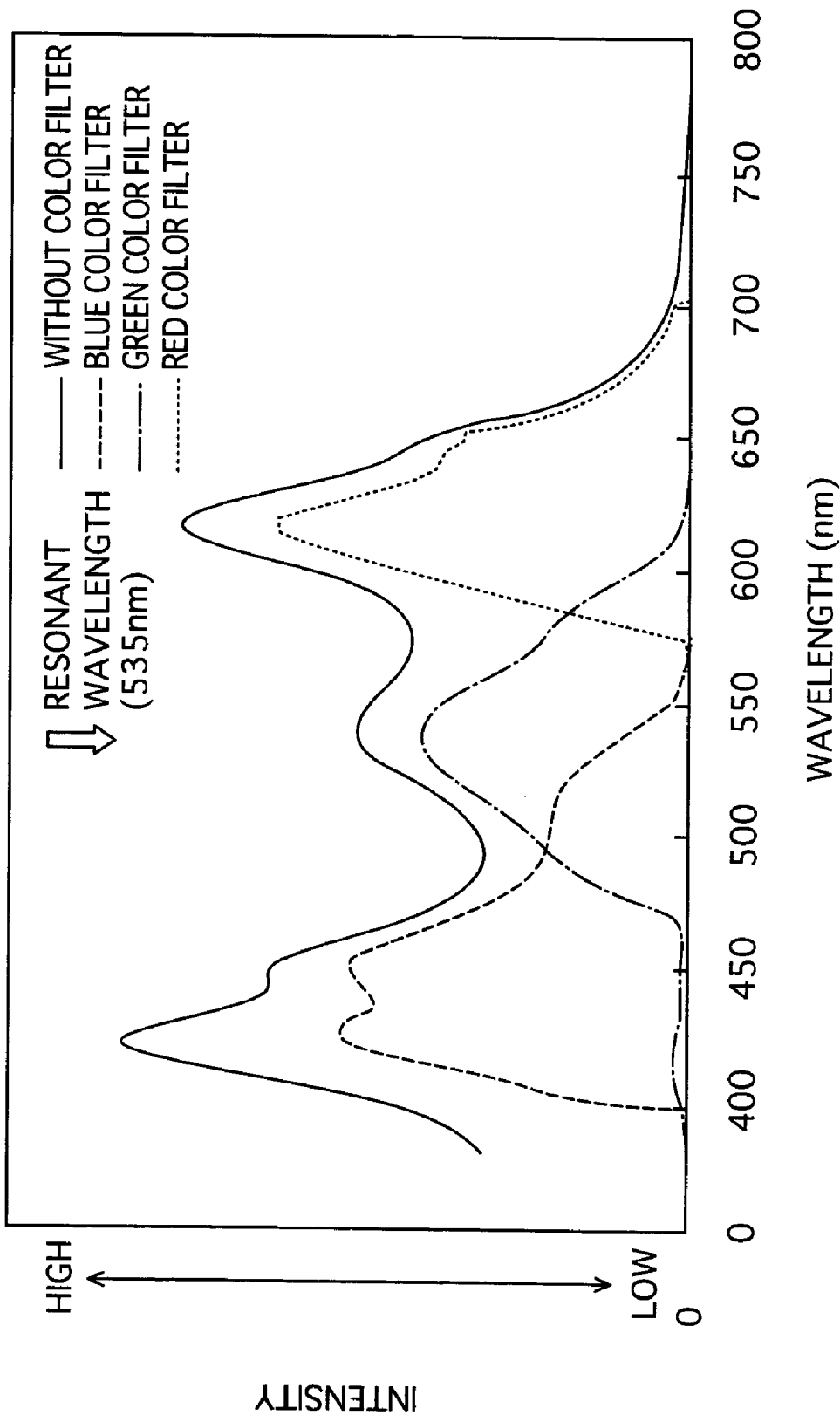
FIG. 3 is a diagram showing luminous intensity characteristic in a case where the luminous intensity of a green component of the three primary colors is increased in the organic EL panel of the embodiment of the present invention.
Figure 4:
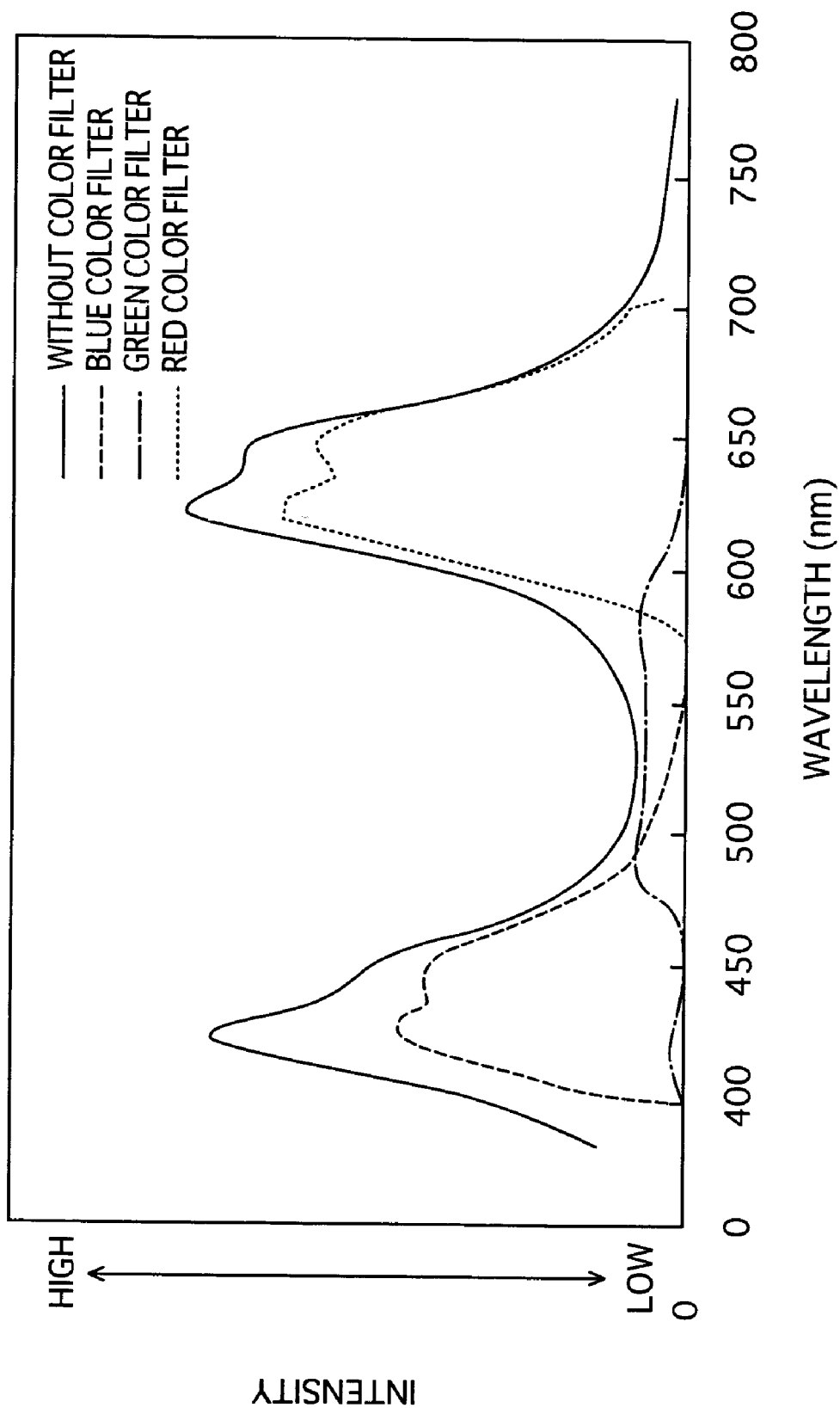
FIG. 4 is a diagram showing luminous intensity characteristic in a case where a green component is small compared to the other components in the three primary colors, in a conventional organic EL panel.

As a result of setting the resonant wavelength to the green region, the luminous intensity of green light before transmission through the color filters 112r, 112g, and 112b is increased to be comparable to those of red light and blue light (FIG. 3), unlike in a conventional example where the resonant wavelength does not fall within the green region (FIG. 4).

Furthermore, both of the transmission rates of red light and blue light respectively through the color filter 112r and the color filter 112b are smaller than the transmission rate of green light through the color filter 112g. Therefore, after transmission through the color filters, the final luminous intensity for all the three primary color lights to be emitted outside will be uniform.

Note that in the above-described embodiment, the organic light emitting layer 202 has a double structure made of the blue light emitting layer 202a for emitting blue light and the orange light emitting layer 202b for emitting orange light, and white light is obtained by synthesizing the blue light and the orange light. However, as long as the lights used have complementary colors to each other, limitations such as wavelength of emitted light and number of light emitting layers are not necessary.

<Case where Other Component than Green Lacks Luminous Intensity>

The above description assumes a case where the luminous intensity for the green light is the lowest. However, in a case where the luminous intensity for other colors of light is the lowest, the present invention can enhance the luminous intensity of the other colors by making the resonant wavelength to coincide with the wavelength of the color of light lacking luminous intensity.

Figure 5:
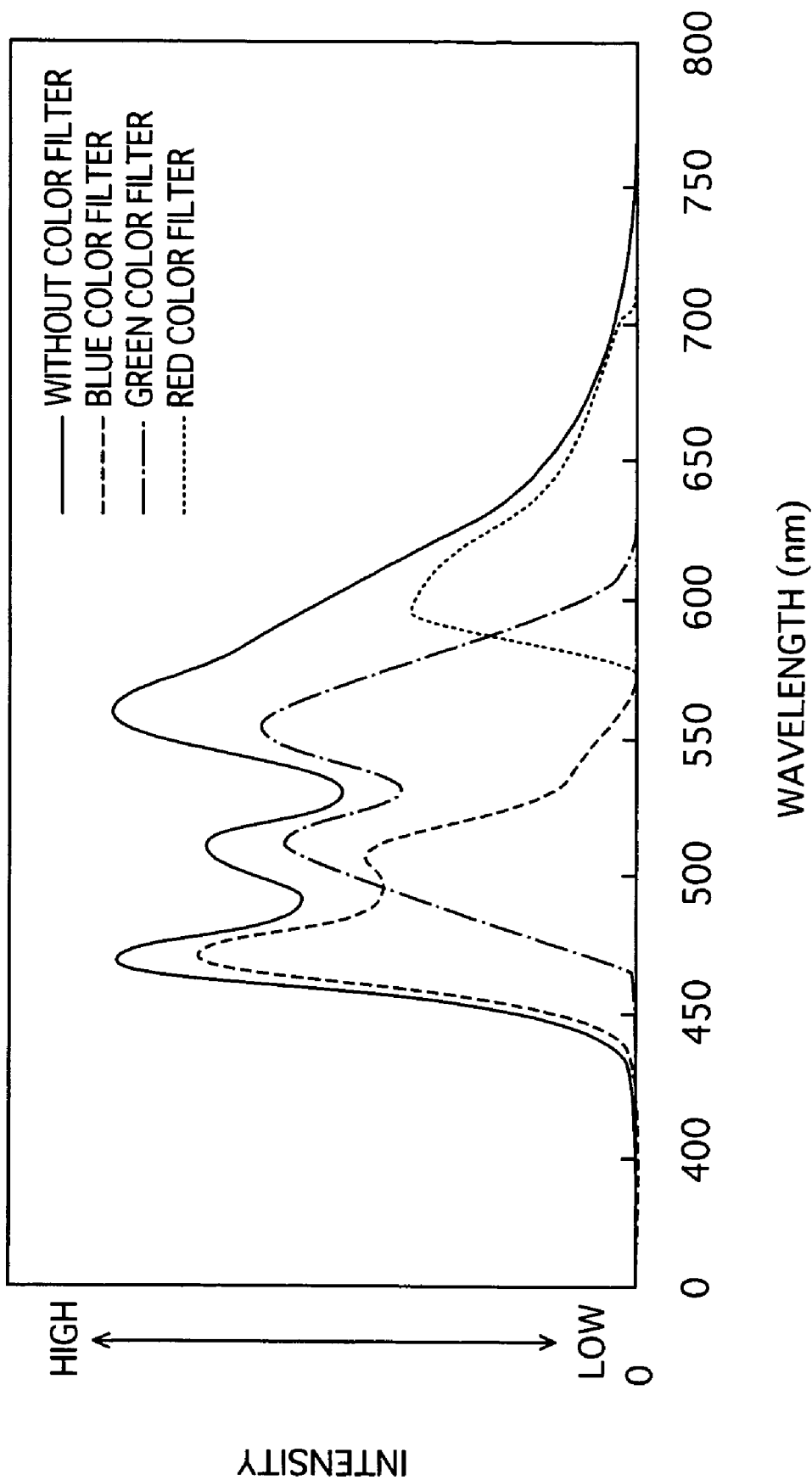
FIG. 5 is a diagram showing luminous intensity characteristic in a case where a red component is small compared to the other components in the three primary colors, in a conventional organic EL panel.

For example, as FIG. 5 shows, there is a case where the luminous intensity of red included in orange light lacks, among the blue and orange lights.

In this example, it is possible that the reproducibility of red color after color filter transmission be impaired.

Figure 6:
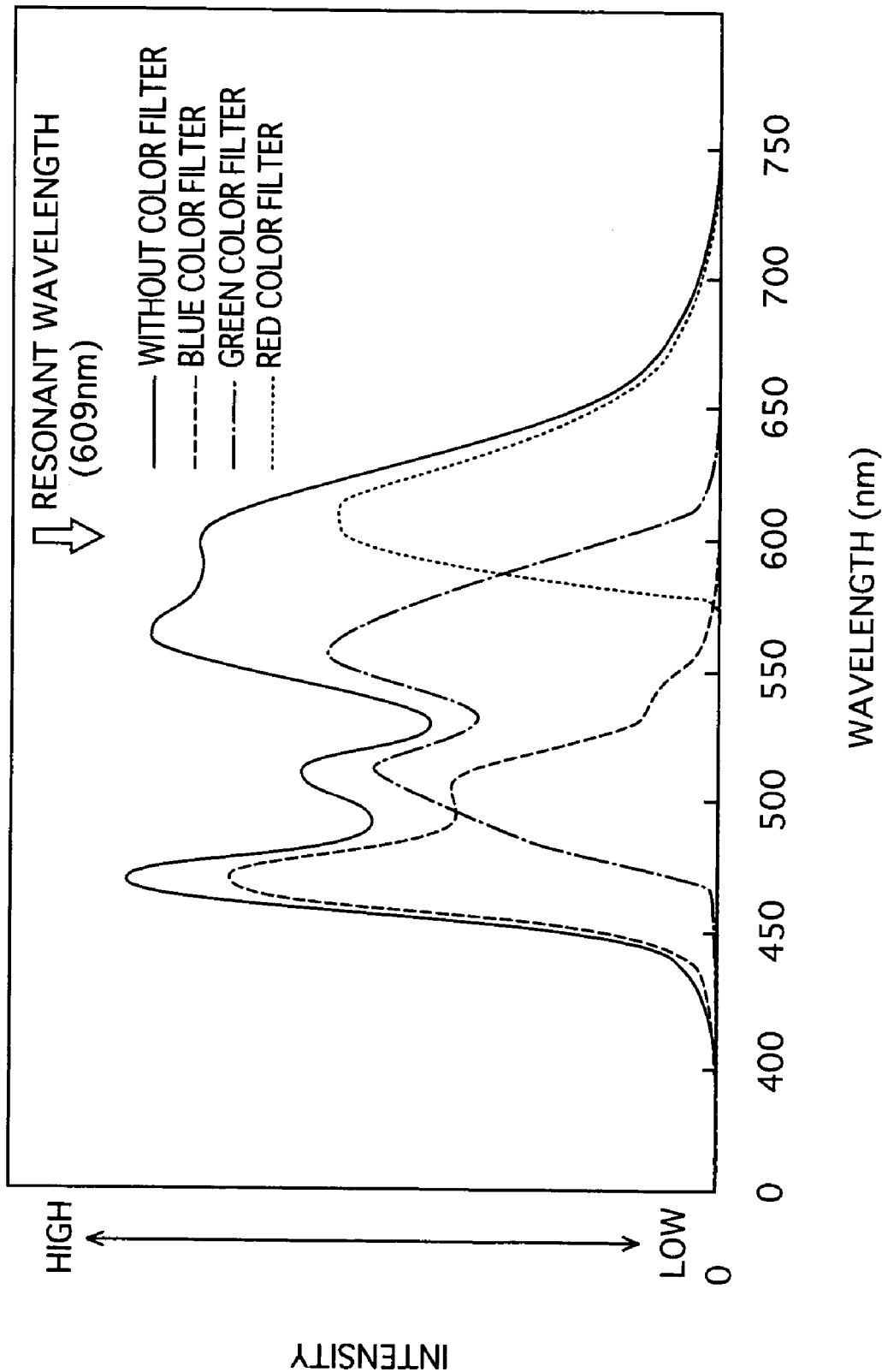
FIG. 6 is a diagram showing luminous intensity characteristic in a case where the luminous intensity of a red component of the three primary colors is increased in the organic EL panel of the embodiment of the present invention.

In such a case, as shown in FIG. 6, the red component is enhanced by setting the resonant wavelength to the red region, so as to render uniform luminous intensity for each of the three primary colors.

More specifically, suppose that film thickness for each layer is: 800 angstrom for anodes; 1100 angstrom for a hole transport layer; 300 angstrom for an orange light emitting layer; 400 angstrom for a blue light emitting layer; and 100 angstrom for an electron transport layer. Also suppose that refractive indices for the layers are specifically: 2.2 for the anodes, and 1.8 for the other organic layers. Then the optical distance $L_O$ is obtained using the following equation.

$$L_O = 800*2.2 + 1100*1.8 + 300*1.8 + 400*1.8 + 100*1.8 \quad \text{(Equation 3)}$$

The value of $L_O$ calculated from this equation 3 is 518 nm, and the value of $(\phi/(2\pi))$ will be $-0.7$.

Therefore, the resonant wavelength will be 609 nm, which is desirably within the red region.

In addition, as already described above, the resonant wavelength will vary, taking a production accuracy into consideration. Therefore, realistically, the luminous intensity of red light will be equalized to those of blue light and green light if the resonant wavelength $\lambda_O$ is set in the range of 560 nm-650 nm (i.e. the red region). Accordingly, the resonant wavelength $\lambda_O$ should be set within the range.

Note that in such a case, the organic layer film thickness will be 1750 nm-2100 nm.

Although the present invention has been fully described by way of examples with references to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A top emission type light emitting display apparatus that realizes color display, comprising:
    a plurality of organic light emitting devices, each of which includes an organic light emitting layer composed of a blue light emitting layer for emitting blue light and an orange light emitting layer for emitting orange light that are stacked in a thickness direction, has a resonant structure in which a thickness of the organic light emitting device is adjusted such that a resonant frequency is set within a green region of the spectrum, and outputs white light produced by synthesizing the blue light and the orange light that are complementary to each other, via the resonant structure, the white light including red light, the green light, and the blue light that constitute three primary colors; and
    a plurality of wavelength selection units provided on a path through which the white light is outputted, each wavelength selection unit transmitting any one of the lights of the three primary colors included in the outputted white light,
    wherein a difference in luminous intensity between the green light and the red light and a difference in luminous intensity between the green light and the blue light are reduced due to resonance caused by the resonant structure.

2. The light emitting display apparatus of claim 1, wherein the green region of the spectrum is a wavelength band in a range of 520 nm to 560 nm, inclusive.

* * * * *